INVENTOR
FREDRICK J. STRIETER
By John D. Graham
ATTORNEY

INVENTOR
FREDRICK J. STRIETER
By John G. Graham
ATTORNEY

INVENTOR
FREDRICK J. STRIETER
By John D. Graham
ATTORNEY

INVENTOR
FREDRICK J. STRIETER
By John G. Graham
ATTORNEY

INVENTOR
FREDRICK J. STRIETER
By John G. Graham
ATTORNEY

United States Patent Office 3,390,025 Patented June 25, 1968

3,390,025

METHOD OF FORMING SMALL GEOMETRY DIFFUSED JUNCTION SEMICONDUCTOR DEVICES BY DIFFUSION

Frederick J. Strieter, Richardson, Tex., assignor to Texas Instruments Incorporated, Dallas, Tex., a corporation of Delaware Continuation of application Ser. No. 422,695, Dec. 31, 1964. This application Aug. 14, 1967, Ser. No. 660,528
7 Claims. (Cl. 148—187)

This application is a continuation of application No. 422,695, filed Dec. 31, 1964, now abandoned.

The present invention relates to semiconductor devices, more particularly to diffused junction diodes and diffused junction transistors, and even more particularly to small geometry diffused junction diodes and small geometry diffused junction transistors.

There is a continuing trend in the semiconductor field to demand devices operable at higher frequencies and capable of switching at higher speeds. In response to this demand, both diodes and transistors have been fabricated to incorporated design considerations in order to obtain these required operating characteristics. In particular, the physical dimensions of the diodes or the transistors must be made very small, especially the junction areas of these devices, in order to enable them to be operated at the high range of frequencies and the switching speeds demanded by space age requirements.

There is associated with the junctions of semiconductor devices, such as diodes or transistors, a capacitive reactance, which at high frequencies is of significant value to retard the operation of these devices. In addition when a diode is switched from forward to reverse bias, the storage of minority carriers in the body of the device can cause large transient reverse current. This effect is very important in diode switching circuits because it appears that the switch does not open immediately and slows down the switching operation. To overcome these objections and to provide higher frequency and faster switching devices, it is necessary to have as small an operating junction area as possible, thus minimizing the capacitive reactance and the minority carrier storage at the junction. In addition, the reduced junction area will correspondingly mean reduced leakage current across the junction.

In response to this need for small junction areas, there is presently known in the art diffused junction transistors and diffused junction diodes which utilize a photographic masking technique in their manufacture. For example, it is known to form an oxide layer on a surface of a silicon substrate and to apply a layer of photoresist material over the oxide layer. A photographic mask having opaque areas corresponding to the apertures to be formed for diffusion purposes is then placed over the photoresist and a photographic expousre made. Regions of the photoresist not covered by opaque regions of the mask are thus rendered etch resistant while the mask regions can be dissolved to uncover the underlying regions of the oxide layer which can then be apertured by use of an etchant which does not affect the etch resistant portions of the photoresist coating. As a result of this photographic technique, junction diodes and transistors having relatively small diffusion apertures (and consequently small junction areas) may be produced.

When such apertures, however, are required to have areas of the order 0.1 sq. mil or less, the limits of resolution in the photographic mask can result in undesired irregularities in the shape of the apertures produced. In particular, when using a mask having rectangular opaque areas, apertures may be produced having corners rounded to such an extent that the production of reasonably rectangular apertures having areas of about 0.1 sq. mil or less is impracticable. Furthermore, the small dimensions involved present a formidable resolution problem in aligning the masks or patterns for the series of diffusion steps needed to produce the desired junctions. Hence, there will be a corresponding limitation upon the size of the junctions' areas that may be formed, thus limiting the frequency and the switching speed at which transistors and diodes may be operated.

With this difficulties heretofore encountered in mind, it is an object of this invention to provide improved semiconductor devices having extremely small diffusion apertures which are well defined.

A particular object is to provide a method of making small area diffused regions in semiconductor devices without requiring the alignment of masks and patterns to the same degree of criticality as the regions themselves.

It is another object of this invention to provide improved semiconductor devices having extremely small opearting junction areas, allowing for higher frequency and faster switching operation.

It is another object of this invention to provide improved semiconductor devices having minimum reverse leakage currents across the junctions.

It is a further object of this invention to provide, in particular, P-N diodes, P-I-N diodes, and transistors having the above-mentioned objects.

These and other objects are accomplished by the process described in the following embodiments in which narrow elongated slots formed by photographic techniques have a width corresponding approximately to the desired diameter of the apertures to be produced. Other narrow elongated slots are subsequently formed, oriented in a manner so as to intersect the orginally formed elongated slots, whereby the substrate is exposed only in the area common to both apertures. Since the length of the elongated slots is comparatively large in comparison to the width of the said slots, it will be possible to intersect the first formed slots with subsequently formed slots without a high degree of resolution on the part of the operator. In addition, although each of the elongated slots will have the distortion and irregularities in the form of rounded corners, etc. which were mentioned above, these distortions will occur at the ends of each of the slots. Since the intersection of the slots occurs at points between the ends, it is possible to produce at these intersections very small apertures which are well defined and free from distortion.

In accordance with a specific aspect of this invention, therefore, various diffusions may be made into these extremely small apertures, resulting in the production of extremely small junction areas, thereby allowing the particular semiconductor device to operate as a high frequency, high speed switching device. The sole limitation, therefore, upon the minimum area to which device junctions may be fabricated using the process described in this invention, is the width to which each elongated slot may be formed.

The novel features believed characteristic of this invention are set forth in the appended claims. The invention itself, however, as well as other objects and advantages thereof, may best be understood by reference to the following detailed description of illustrative embodiments, read in conjunction with the accompanying drawings, wherein:

Reference is made to FIGURES 1–4, wherein there is illustrated a small geometry diode semiconducting device, at various stages of manufacture thereof, in accordance with the present invention. It is to be noted that these views are of only one segment of an entire semiconductor slice which comprises many such segments during manufacture and is separated into individual wafers only after the diffusions have been made and contacts applied.

Figure 1:
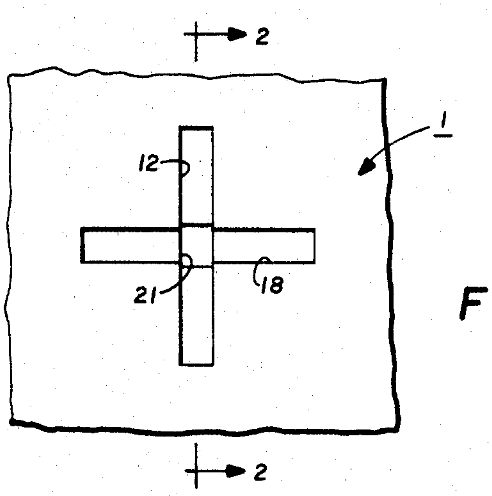
FIGURE 1 is a plan view of a small geometry P-N diode constructed in accordance with the present invention.
Figure 2:
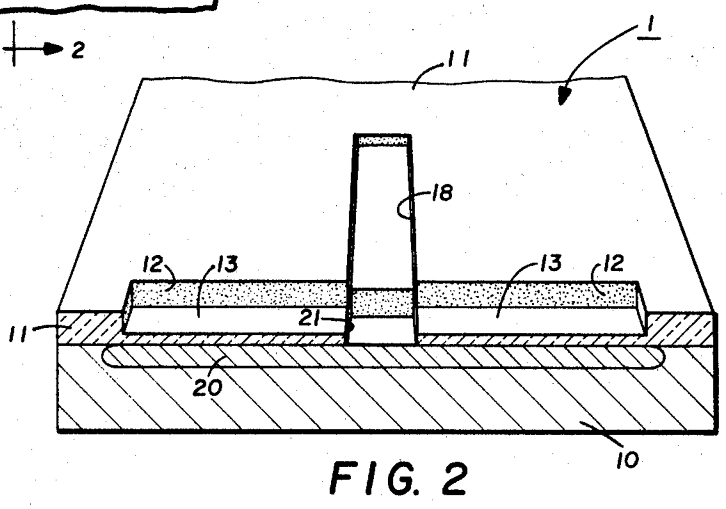
FIGURES 2 and 3 are pictorial views in section of the device of FIGURE 1, taken alon the line 2—2, at various stages of manufacture.

There is illustrated in FIGURE 1 a plan view of a small geometry P-N diode 1 constructed in accordance with the present invention, showing the thin cross stripes 12 and 18, and the small opening at the intersection 21. There is represented in FIGURE 2 an intrinsic body of semiconductor material 10 such as silicon or germanium for example. By the term "intrinsic" is meant a material having a high resistivity due to low concentration of impurities or due to the presence of trapping levels. This value of resistivity may be 100Ω-cm. for example. An insulating layer 11 is formed over the entire surface of the material 10 using any conventional technique and material such as silicon oxide. In accordance with one specific aspect of the present invention, the insulating layer 11 would be formed of silicon oxide to a thickness of approximately 8000 A.

After the insulating layer 11 has been deposited, an elongated strip 12 of the layer is selectivity removed so as to expose an elongated area of the surface of the semiconductor material 10. This removal may be accomplished by first coating the insulating layer 11 with a photoresist material such as one of the Kodak resist designated KMER or KTFR, the latter being preferred. Next, a photomask is placed in contact with the surface of the photoresist film. Due to thickness of the photomask, the location of the opaque portion of the photomask relative to the surface of the resist, and the wave length of the exposing light, the light tends to be refracted around any portion of the photomask. This prevents accurately exposing the photoresist around a very small dot. However, refraction of the exposing light is of concern only in one direction around an opaque line on the mask so that the width of a strip of the photoresist masked from exposure can be controlled with considerable accuracy. The mask and unexposed area of the photoresist is then removed by a developing solution to expose the surface of the oxide insulating film 11 in the elongated area 12. Using this technique, it is possible with the state of the art at its present level to remove a strip of photoresist approximately 0.1 mil in width, while the length of the strip removed might be as much as 3 mils. After the unexposed strip of the photoresist is removed by developing, the substrate is subjected to a suitable etching fluid, such as a buffered HF solution saturated with ammonium bifluoride, and the portion of the oxide film 11 which is not protected from the etchant by the resist is selectively removed to form the elongated slot 12 and expose an area of the substrate approximately the same size as the strip of the photoresist removed, in other words, approximately 0.1 mil in width and approximately 3 mils in length. The photoresist material is then stripped from the surface of the oxide insulating layer 11.

The silicon oxide layer 11 which remains upon the intrinsic material 10 serves a number of objectives, two of which are of particular significance. First, the layer is formed of a material into which impurities to be employed during subsequent manufacturing steps will not diffuse. Second, the thickness of the silicon oxide layer 11 plays a significant role in the process of the present invention, which significance will be subsequently observed.

As a further step in the manufacture of the small geometry diode, as illustrated in FIGURE 2, there is provided upon the upper surface of the semiconducting material 10 and within the elongated opening 12, a predetermined amount of acceptor impurity. Application of sufficient heat to the material 10 and the impurity results in a diffusion of the impurity applied into the body of intrinsic material 10 so as to produce a region proportion 20 of P-type silicon within the body of intrinsic material 10. During this diffusion and also during the impurity deposition preceding the diffusion, there is normally produced an oxidation of surface silicon so that a very thin silicon oxide layer 13 is formed as indicated in FIGURE 2. This layer 13 is substantially thinner than the silicon oxide insulating layer 11 which was previously grown purposefully. For example, the silicon oxide layer 13 which is naturally produced during the acceptor impurity diffusion step would be of a thickness of approximately 1500 A. to 3500 A., while the oxide layer 11 would be fabricated to a thickness of approximately 8000 A., or over two times the thickness of layer 13.

A coat of photoresist, thereafter, is deposited upon the silicon oxide layers 11 and 13 and exposed in all areas except for an elongated area corresponding to the slot 18. The photoresist is then developed, and the exposed area is subjected to the fluid etchant, buffered HF solution. The silicon oxide layer 13, being substantially thinner than the silicon oxide layer 11, will completely etch away within the exposed portion, thereby exposing the P-type region 20 within the intersection area 21, without danger of the insulating layer 11 also being cut away completely. The remaining photoresist is then removed by a suitable stripping fluid.

As a result of the above-described process, there is produced at the intersection area 21 a small aperture exposing the upper surface of the P-type region 20 and into which impurities to be employed during a subsequent N-type diffusion operation may be deposited. This aperture may be as small as necessary in order to obtain any desired operating characteristics of the present invention, the small geometry diode. In one embodiment of the invention, the slots 12 and 18 were formed approximately 0.1 mil in width and approximately 3 mils in length. This resulted in an aperture or opening at the area 21 of approximately 0.01 square mil.

Figure 3:
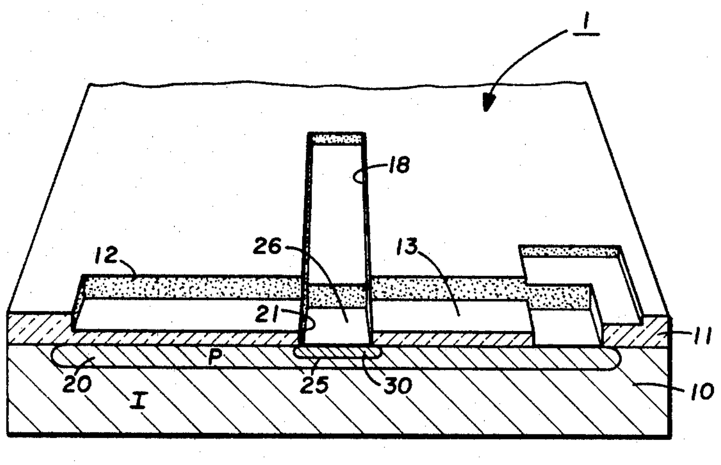

As a next step in the manufacture of the small geometry P-N diode, as illustrated in FIGURE 3, there is disposed into the small aperture or opening formed at the intersection area 21 and upon the upper surface of the P-type region 20 a predetermined amount of donor impurity, and heat is applied whereby the impurity diffuses into the region 20 to form an N-type layer 30. Intermediate the regions 20 and 30 there is provided a junction 25 in the well-known manner whereat particular desired electrical characteristics are realized. It is to be noted that the unremoved portion of the silicon oxide layer 13 serves as a mask to limit the lateral diffusion of the donor impurity. During the N-type diffusion and/or the impurity deposition a very thin silicon oxide layer 26 is formed which completely covers the exposed surface of the N-type layer 30.

Figure 4:
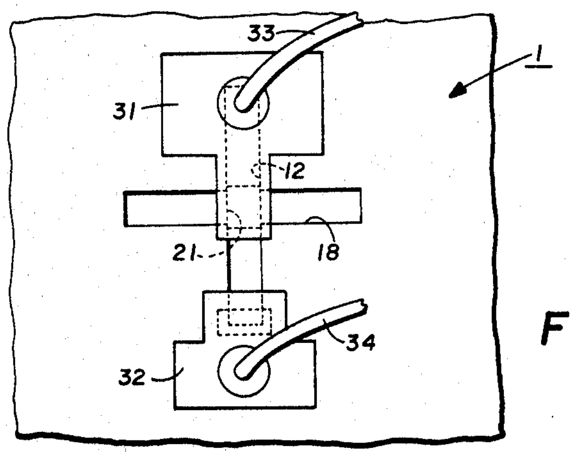
FIGURE 4 is a plan view of a small geometry P-N diode device shown with the expanded ohmic contacts and external leads connected thereto.

As a further step in the manufacture of the small geometry diode, there will be attached external leads so as to allow for operation as a high frequency, high speed switching device. Due to the extremely small dimensions associated with the diffused regions of the present invention, expanded contacts are utilized. The etchant fluid is first applied completely covering the surface of the entire device shown in FIGURE 3. Since the silicon oxide layer 26 is substantially thinner than the oxide layers 11 and 13, it will be relatively simple to closely control the duration of etching so as to completely remove the layer 25 without consequently cutting through the other layers 13 and 11. There is thereby provided a region where an expanded ohmic contact may be placed so as to allow an external lead to be connected to the cathode, or N-type layer 30. The entire device then goes back through a photomasking process whereby the silicon oxide layer 13 is selectively etched and removed to form an opening above the upper surface of the P-type region 20. There is thereby provided a region whereby an expanded ohmic contact may be placed so as to allow an external lead to be connected to the anode or P-type layer 20. An aluminum coating is then formed completely covering the upper surface of the device. This may be accomplished by any conventional method as, for example, vacuum evaporation. Thereafter, the entire device again goes through a photographic masking and etching process which selectively removes the aluminum coating from substantially all portions except where the expanded ohmic contacts are to be placed. The aluminum coating remaining at the openings is then alloyed in the conventional manner into the underlying silicon. In this manner there is provided over the N-type layer 30 and over the P-type layer 20 expanded ohmic contacts 51 and 52, respectively, as illustrated in FIGURE 4. Since the width of the elongated slots 12 and 18 will normally be as narrow as photographic masking techniques will allow, presently at a value of approximately 0.1 mil, the expanded ohmic contacts 51 and 52 will necessarily overlap onto the insulating layers 11 and 13 as shown in FIGURE 4. This will present no problems since the layers 11 and 13 were fabricated from a nonconducting material, usually silicon oxide. Gold wires are then ball bonded to the expanded ohmic contacts 51 and 52 in a conventional manner to form the external cathode lead 53 and external anode lead 54. As a result of the extremely small region 21 provided at the intersection of the slots 12 and 8, a very small P-N junction has been fabricated, thus allowing the completed diode 1 to be operated at very high frequencies and at high switching speeds.

As an alternate method of producing the expanded ohmic contacts 51 and 52, the aluminum coating may be replaced by one of gold and molybdenum. Despite its advantages for use as a contact material in semiconductor devices, aluminum has nevertheless a number of disadvantages that are not characteristic of gold and molybdenum. The first and most prominent is that when the gold wires are bonded to aluminum ohmic contacts, an intermetallic compound of gold and aluminum is formed. This compound, being brittle, decreases the reliability of the devices upon which it is formed. In addition there is evidence that the application of aluminum films by means of evaporation often results in electrical degradation of semiconductor devices in the form of shorts, high saturation currents, decreased gain, and undesirably low reverse breakdown characteristics.

To overcome these disadvantages the ohmic contracts 51 and 52 may be fabricated from molybdenum and gold in the following manner. A thin film of molybdenum is first applied to the upper surface of the device 1 shown in FIGURE 3. Then the molybdenum is covered with a thin film of gold, and thereafter the gold and molybdenum are etched away in unwanted areas, leaving the desired pattern of contacts. It should be noted that with the use of molybdenum and gold, there is essentially an "alloy-less" system. The molybdenum is not alloyed into its substrate, and the gold does not alloy with molybdenum. In contrast with aluminum where the deposited metal is ordinarily heated to a temperature above the aluminum silicon eutectic 557° C., the gold and molybdenum layers are deposited at reasonably low temperatures and need no heating to produce alloying. Since heating steps are avoided, degradation of the semiconductor devices is minimized.

Figure 5:
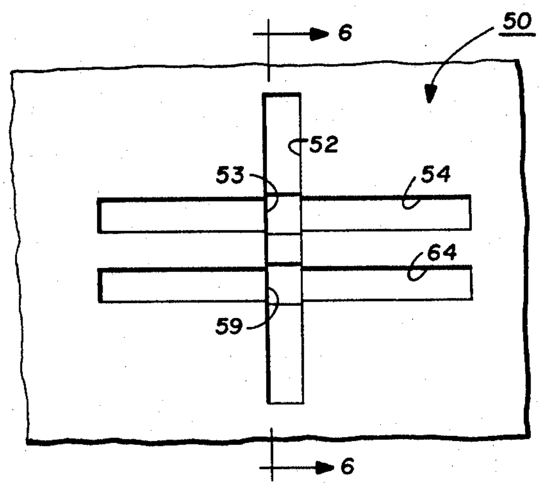
FIGURE 5 is a plan view of a small geometry P-I-N diode constructed in accordance with the present invention.
Figure 6:
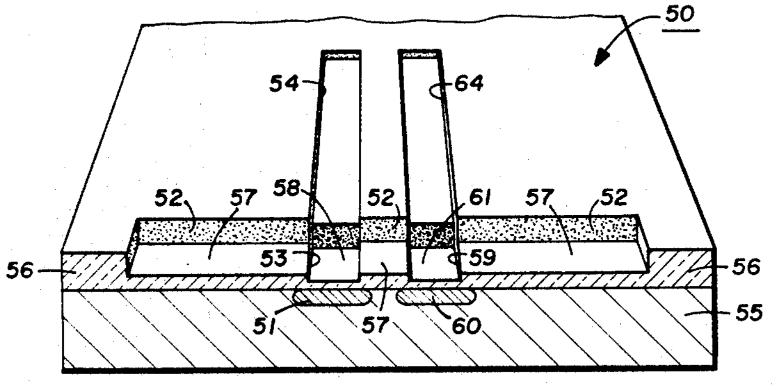
FIGURE 6 is a pictorial view in section of the device of FIGURE 5, taken along the line 6—6, showing the manufacture thereof.
Figures 7, 8:
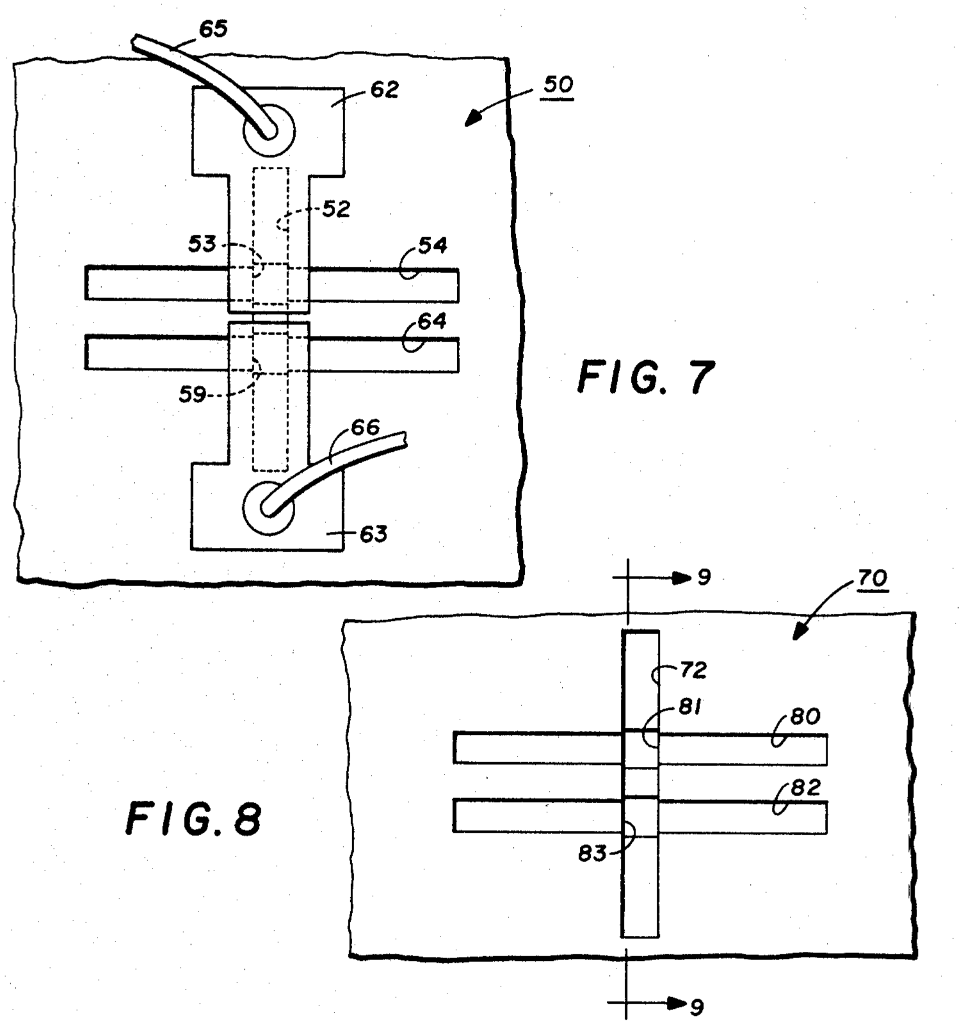
FIGURE 7 is a plan view of a small geometry P-I-N diode with the ohmic contacts and external connections thereof.
FIGURE 8 is a plan view of a small geometry surface-oriented transistor constructed in accordance with the present invention.

Considering now the present invention as it relates to surface-oriented small geometry P-I-N high frequency diodes, reference is made to FIGURES 5–7 of the drawings. FIGURE 5 shows a schematic top view of the steps in the manufacture of the P-I-N diode 50. As can best be seen in the sectional view of FIGURE 6 taken along the line 6—6 of FIGURE 5, the diode 50 is comprised of the intrinsic material 55 having an oxide layer 56 completely covering the upper surface of the material 55. The oxide layer 56 may be composed of any conventional material, preferably silicon oxide, which may be formed upon the surface of the substrate by reactive sputtering or other suitable techniques. The oxide layer 56 would be formed to a thickness of aproximately 8000 A. and would be nonconductive in nature.

After the oxide layer 56 has been deposited, an elongated strip 52 of the layer is selectively removed so as to expose an elongated area of the surface of the intrinsic material 55. This may be accomplished by the same photographic techniques outlined above for the manufacture of the small geometry P-N diode. As a result of this photographic and etching process, there is formed the elongated slot 52, approximately 0.1 mil in width and approximately 3 mils in length. A second insulating layer 57 is next formed over the surface of the first insulating layer 56 and over the exposed surface of the intrinsic semiconductor region 55. In accordance with one important aspect of the present invention, the insulating layers 56 and 57 may be of the same material, preferably of silicon oxide. Close control over the etching process to be presently described may be maintained by fabricating the second insulating layer 57 to a thickness substantially smaller than the first insulating layer 56. For example, if the first silicon oxide layer 56 is of a thickness of 8000 A., the second silicon oxide layer 57 could be of a thickness of 2000 A.

A coat of photoresist is then deposited on the second insulating layer 57 and exposed in all areas except for an elongated area corresponding to the slot 54. Then when the photoresist is developed, and the device 50 subjected to the fluid etchant, buffered HF solution, the oxide layer 57 is selectively removed to form a slot 54. As a result of the difference in oxide thickness, the etchant will remove the second layer 57 to expose the upper surface of the intrinsic material 55 at the aperture 53 without consequently cutting through the first silicon oxide layer 56. As a result of the above-described process, there is produced a small aperture 53 into which impurities to be employed during a subsequent P-type diffusion operation may be deposited. Since the slots 52 and 54 would be approximately 0.1 mil in width, for example, the small aperture 53 will then be of an area of approximately 0.01 square mil.

As a further step in the manufacture of the surface oriented P-I-N high frequency diode, as shown in FIG- URE 6, there is disposed upon the upper surface of the intrinsic material 55 within the small aperture 53 a predetermined amount of acceptor impurity. Heat is then applied so as to cause the impurity to diffuse into the substrate to form the P-type region 51. The insulating layer 57 will act as a diffusing mask so as to limit the lateral diffusion of the acceptor impurity into the substrate. During this diffusion process there will be naturally formed a very thin layer 58 of silicon oxide which will completely cover the exposed surface of the P-type region 51.

In the identical manner as the elongated slot 54 was previously formed, the elongated slot 64 is now formed so as to intersect the slot 52. Using the photographic technique and etching process described above, the insulating layer 57 is selectively removed in the area of the slot 64, thus exposing the upper surface of the intrinsic material 55 within the area of the small aperture 59. The aperture 59 will also be of an area 0.01 sq. mil, for example. Into this aperture 59, there is then diffused a predetermined amount of donor impurity so as to form the N-type region 60. There will again be normally produced a very thin silicon oxide layer 61 which will completely mask the exposed surface of the N-type region 60.

It is to be pointed out that the positioning of the slot 64 with respect to the slot 54 will determine the width of the intrinsic layer 55 between the P-type region 51 and the N-type region 60, thus determining the operating characteristics of the entire diode 50. This positioning may be closely controlled through the use of the photographic masking techniques outlined above.

As the final steps in the manufacture of the present invention, ohmic contacts will be provided so as to allow external leads to be connected to the anode, or P-type region 51 and to the cathode, or N-type region 60. The upper surface of the device 50 is thereby covered with etchant fluid. Since the silicon oxide layers 58 and 61 are substantially thinner than either of the oxide layers 56 and 57, they will be selectively removed at the openings 53 and 59, respectively, as illustrated in FIGURE 7, without consequently cutting through the layers 56 and 57.

A coating of either aluminum or molybdenum and gold is next deposited upon the upper surface of the device 60. Thereafter, the device again goes through a photographic masking and etching process similar to those already described to selectively remove the coating from unwanted areas, thus forming the expanded ohmic contacts 62 and 63 at the openings 53 and 59, respectively. Gold wires are then ball bonded to the expanded ohmic contacts as illustrated in FIGURE 7 to form the external anode lead 65 and the external cathode lead 66.

Considering now the present invention as same relates to small geometry surface-oriented transistors, reference is made to FIGURES 8–12 of the drawings. FIGURE 8 shows a schematic top view of the transistor 70. As can best be seen in the section view of FIGURE 9, transistor 70 is comprised of the intrinsic material 75 having an oxide layer 76 completely covering the upper surface of the material 75. The oxide layer 76 may be composed of any conventional material, preferably silicon oxide, which may be formed upon the surface of the substrate by reactive sputtering or other suitable techniques. The oxide layer 76 would be formed to a thickness of approximately 8000 A. and would be insulating in nature.

Figure 9:
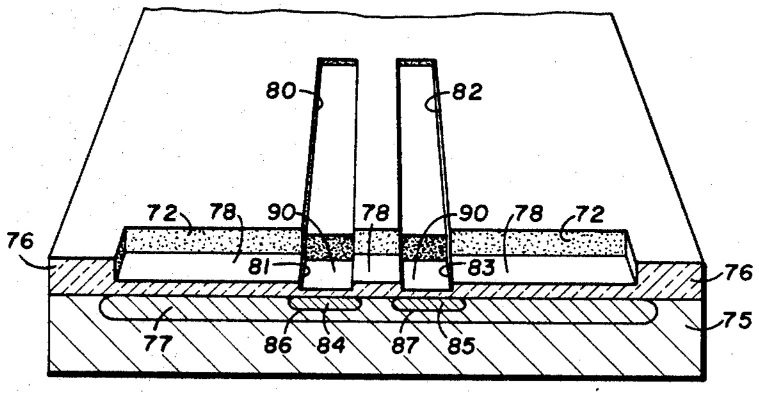
FIGURE 9 is a pictorial view in section of the transistor of FIGURE 8, taken along the line 9—9, showing the manufacture thereof.
Figure 10:
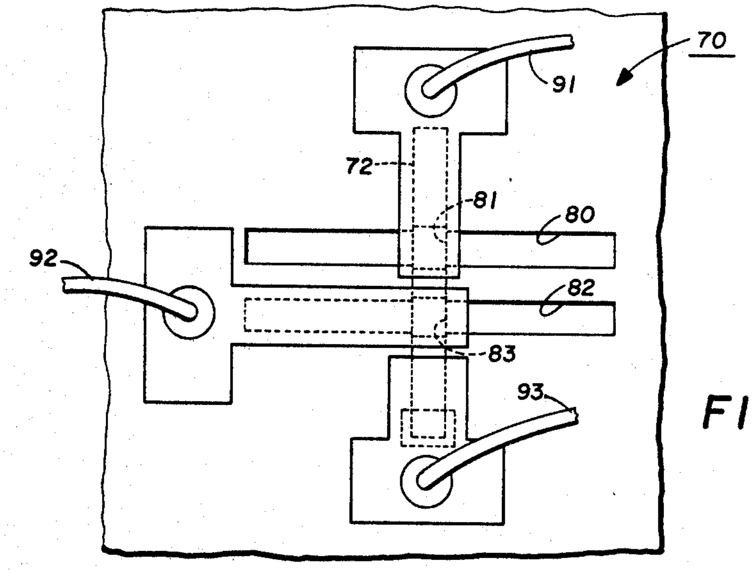
FIGURE 10 is a plan view of a completed small geometry surface-oriented transistor shown with the ohmic contacts and external connections.

After the oxide layer 76 has been formed, a strip 72 of the layer is selectively removed so as to expose an elongated area of the surface of the intrinsic material 75. This may be accomplished by the same photographic techniques outlined above for the manufacture of the small P-N and P-I-N diodes. As a result of this photographic and etching process, there is formed the elongated slot 72 which may be as narrow as 0.1 mil in width and approximately 3 mils in length. As a further step in the manufacture of the small geometry transistor, there is provided upon the upper surface of the semiconductor material 75 and within the elongated slot 72 a predetermined amount of impurity. Application of sufficient heat to the material 75 and the impurity alloy results in a diffusion of the impurity into the body of intrinsic material 75, so as to produce a region or portion 77 of P-type silicon within the body of intrinsic material 75. This region 77 will hereafter be referred to as the base region or layer. During this diffusion there will be normally produced an oxidation of the surface silicon so that a thin silicon oxide layer 78 is formed as indicated in FIGURE 9. As compared to the insulating oxide layer 76 which was purposefully fabricated to a thickness of 8000 A., the thin silicon oxide layer 78 would be naturally formed to a thickness of approximately 1500 A. to 3500 A.

A coat of photoresist is deposited upon the upper surface of the silicon oxide layer 78 and the insulating oxide layer 76 and exposed in all areas except for the elongated regions corresponding to the slots 80 and 82. The photoresist is then developed and the exposed areas 80 and 82 are subjected to the fluid etchant, buffered HF solution, for example. When the insulating layer 76 is fabricated of silicon oxide, the same material that is naturally formed as the layer 78 during the P-type diffusion, the difference in thickness of the two layers (the thickness of layer 76 being approximately two times that of layer 78) will allow for the necessary control to be maintained over the second etching step in order that the very small apertures 81 and 83 may be formed above the P-type base region.

Within the small openings 81 and 83 and upon the exposed surface of the P-type base region 77, there is thereby disposed a quantity of donor impurity, as in the form of a silicon alloy, and heat is applied whereby the impurity diffuses into the region 77 to form N-type regions 84 and 85. The unremoved portion of the thin silicon oxide layer 78 will serve as a mask to limit the lateral diffusion of the donor impurity. As a result of this diffusion there is provided intermediate the base region 77 and the N-type region 84, hereafter referred to as the collector region or layer, a junction 86 which serves as the collector-base junction for the transistor device 70. In like manner, there will be provided intermediate the base region 77 and the N-type region 85, hereafter referred to as the emitter region or layer, a junction 87 which serves as the emitter-base junction for the transistor device 70. Due to the extremely small areas that may be obtained using the cross striping techniques as described to form the openings 81 and 83, it is possible with the state-of-the-art at its present level to produce very high frequency transistor devices with junctions having a functioning area of approximately 0.01 sq. mil. During the N-type diffusion there will be consequently formed a layer 90 of silicon oxide which completely covers the upper surface of the collector layer 84 and the upper surface of the emitter layer 85. This oxide layer 90 will be extremely thin, approximately one-third the thickness of the silicon oxide layer 78, and less than one-sixteenth the thickness of the insulating layer 76.

The thin oxide layer 90 may then be removed by any conventional technique, such as dip etching, the upper surfaces of the emitter region 87 and the collector region 86 thereby being exposed. Subsequently, using a photographic masking and etching process, a portion of the protective oxide layers 76 and 78 are selectively removed to expose the upper surface of the base region 77. Aluminum or molybdenum and gold is then deposited upon the exposed emitter, collector, and base surfaces and selectively etched so as to form expanded ohmic contacts to allow for external collector lead 91, external emitter lead 92, and external base lead 93 to be attached as illustrated in the plan view of FIGURE 10.

Figure 11:
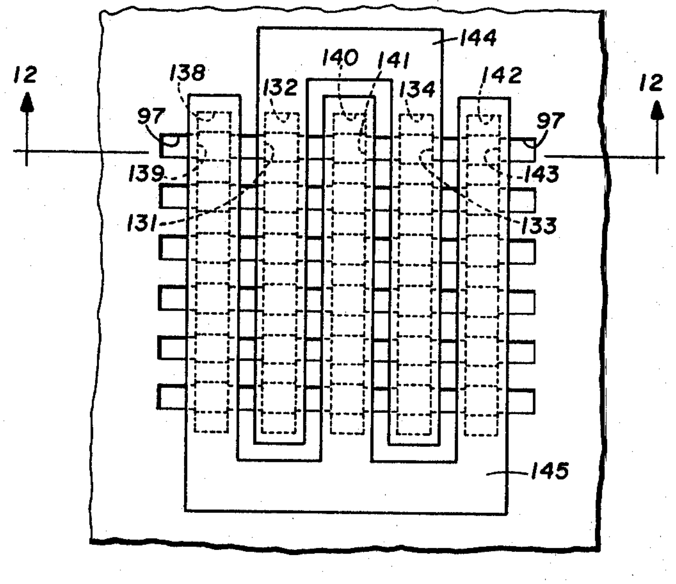
FIGURE 11 is a plan view of a matrix of elongated slots formed for a high power, high frequency transistor.
Figure 12:
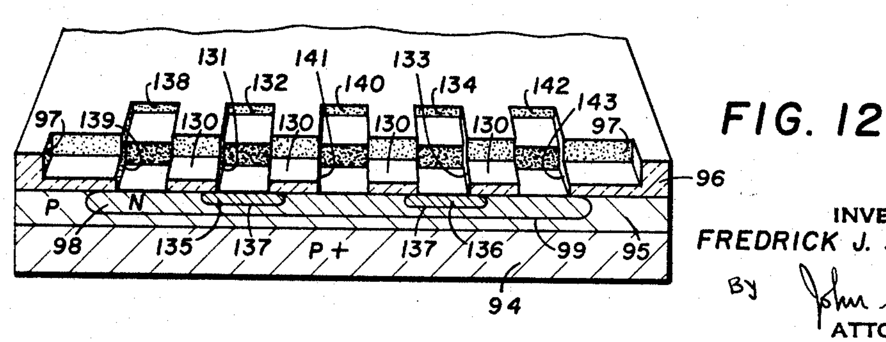
FIGURE 12 is a pictorial view in section of the transistor structure of FIGURE 11 taken along the line 12—12, showing the manufacture thereof.

In accordance with another aspect of this invention, the cross-striping technique used to produce the extremely small junction areas in the previous embodiments may be utilized to form a matrix of elongated slots for high power transistor fabrication as illustrated by the plan view of FIGURE 11. The sectional view of FIGURE 12 shows one portion of this matrix illustrating the fabrication. Referring to FIGURE 12, a thin layer 95 of P-type semiconducting material is formed upon a body 94 of low resistivity heavily doped P-type semiconducting material. The layer 94 will provide better ohmic contact between the layer 95 which serves as the collector region and subsequent external connections. In a manner described for the previous embodiment, an oxide layer 96 formed preferably of silicon oxide is formed above the collector region 95. Thereafter, a very thin elongated strip 97 is selectively removed as before to expose an elongated area of the surface of the collector area 95. Within this area there is diffused an N-type impurity to form a base region 98, thereby producing a junction 99, hereafter referred to as the collector-base junction. During the N-type diffusion operation, there will be naturally grown the thin silicon oxide layer 130. As a further step in the manufacture of the present device, a series of cross-stripes 132 and 134 are formed by the photographic masking and etching techniques which have been previously described producing the apertures 131 and 133 respectively. Within these apertures there is then diffused a P-type impurity forming the layers 135 and 136 hereafter referred to as the emitter regions. In between the emitter regions and the base region 98 there is produced the emitter-base junction 137. A very thin silicon oxide layer will be formed during the P-type diffusion covering the upper surfaces of the emitter regions 135 and 136 within the apertures 131 and 133.

As the next steps in the manufacture of this device the thin elongated slots 138, 140 and 142 are formed, thereby exposing the base region within the openings 139, 141 and 143 respectively. Using any conventional technique, such as dip etching, the very thin silicon oxide layer covering the upper surface of the emitter regions 135 and 136 within the apertures 131 and 133 may be removed without consequently cutting through the oxide layers 96 and 130. Expanded ohmic contacts may then be deposited as shown in FIGURE 11 and selectively etched to connect the emitter regions together forming the emitter contact 144; similarly the base regions may be connected together by the base contact 145. External leads may then be attached to these contacts and directly to the layer 94 adjacent to the collector region 95 shown in FIGURE 12, the resultant device capable of being operated as a high frequency, high power transistor.

Figure 13:
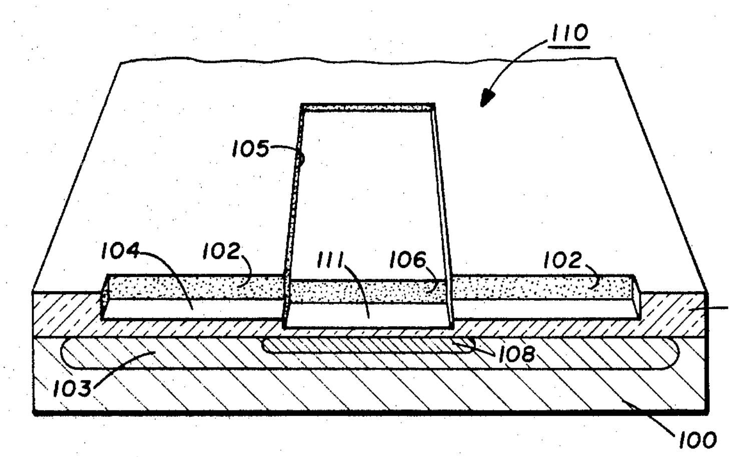
FIGURES 13 and 14 are pictorial views in section showing the manufacture of a high frequency, high power, and high gain transistor.
Figure 14:
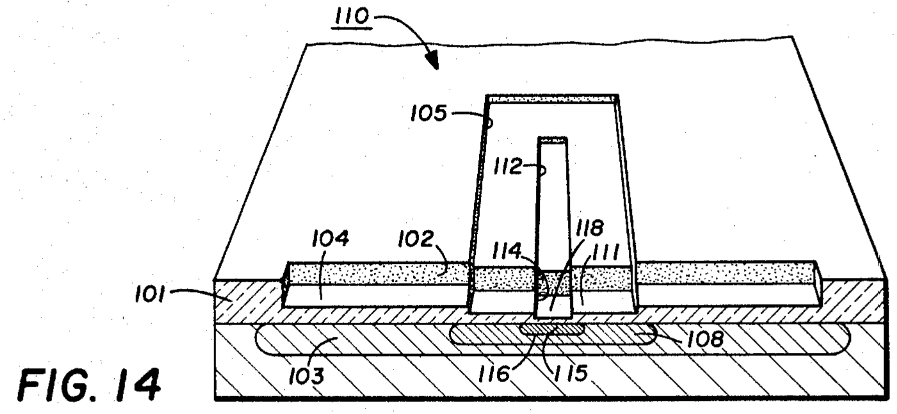
Figure 15:
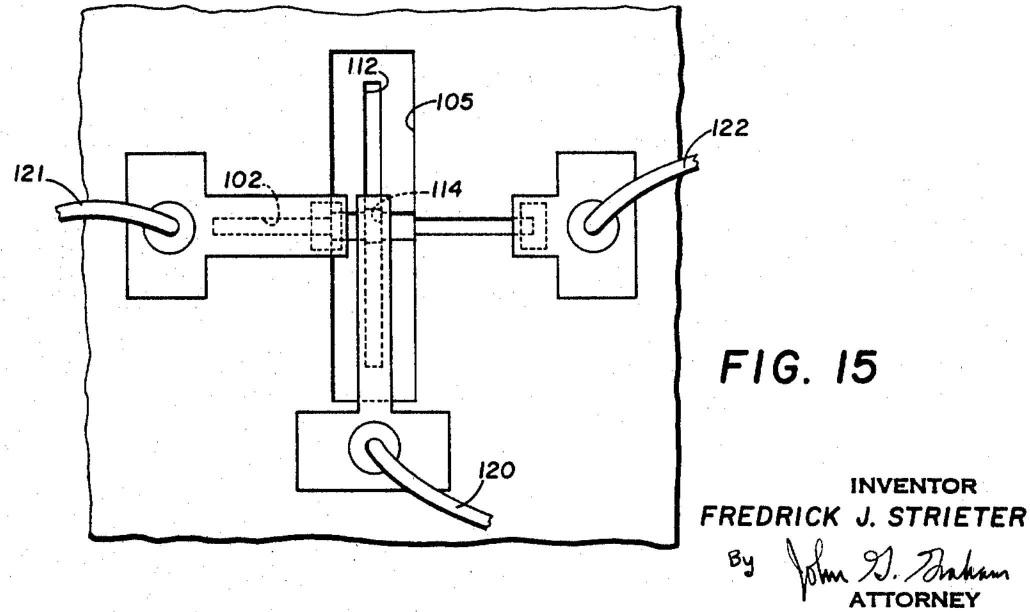
FIGURE 15 is a plan view of the completed device shown in FIGURES 13 and 14 with the ohmic contacts and external leads connected thereto.

There is illustrated in FIGURES 13–15 a method for making a small geometry high-frequency high-power and high-gain transistor. FIGURE 13 shows the sectional view of the first steps of this method. Upon a body of intrinsic semiconductor material 100 there is purposefully grown an oxide layer 101 of insulating material, preferably silicon oxide, having a thickness of several thousand angstroms. Using a photographic masking and etching technique, there is cut away from the layer 101 a strip of material so as to expose the upper surface of the intrinsic material 100 within the elongated slot 102. As pointed out in previous embodiments, this elongated slot may be as narrow as 0.1 mil for example. There is then diffused into the intrinsic material 100 at the slot 102 a predetermined amount of acceptor impurity so as to form the P-type layer 103, hereafter referred to as the collector region or layer. A thin layer of silicon oxide 104 naturally forms during this diffusion process so as to completely cover the upper surface of the P-type collector layer 103 within the elongated slot 102. As a further step in the manufacture of the transistor, a coat of photoresist is deposited upon the insulating layer 101 and upon the silicon oxide layer 104 and exposed in all areas except for an area corresponding to the region 105 as depicted in FIGURE 13. The photoresist is then developed and the exposed area 105 is subjected to a fluid etchant, buffered HF solution. The silicon oxide layer 104 will therefore be etched away and the upper surface of the P-type collector layer 103 will thereby be exposed at the intersection of the areas 102 and 105 within the openings 106.

As another step in the manufacture of the present device, there is disposed into the opening 106 and upon the upper surface of the collector region 103 a predetermined amount of donor impurity, and heat is applied whereby the impurity diffuses into the collector region 103 to form an N-type layer 108, hereafter referred to as the base layer or region. As a result of this diffusion process, there is again formed a thin silicon oxide layer 111 which completely covers the upper suface of the base layer 108. Intermediate the base region 108 and the collector region 103 there is provided a junction 109 which will serve as the collector-base junction of the transistor device 110.

As a further step in the manufacture of the present invention, as depicted in FIGURE 14, a coat of photoresist is deposited upon the upper surface of the transistor 110 and exposed in all portions except in the area 112. Application of the etchant fluid will result in selectively etching away the silicon oxide layer 111 so as to expose the upper surface of the base layer 108 at the intersection of the elongated slot 112 and the elongated slot 102. There is thereby formed at the intersection of the slot 112 and the slot 102 a small opening 114 into which a small amount of acceptor impurity is deposited and subsequently diffused into the base area 108 to form a P-type layer 115, hereafter referred to as the emitter layer or region. In a normal manner, there is again produced a very thin silicon oxide layer 118 completely covering the upper surface of the emitter layer 115 as illustrated in FIGURE 14. Intermediate these two layers there is produced a junction 116, which serves as the emitter-base junction.

Pursuant to the description above, it is to be noted that the width of the elongated slot 105 is approximately five times as large as the width of the elongated slot 112. For example, if the slot 112 is formed to a width of 0.1 mil, the width of the slot 105 will be approximately 0.5 mil.

This difference in width will allow the placing of the elongated slot 112 within the boundaries defined by the slot 105 by photographic masking techniques without presenting a formidable task of resolution. As a result, the emitter layer 115 may be diffused above the collector layer 103 rather than to the side of the collector layer as the surface-oriented embodiment describes and is illustrated in FIGURES 8–12. Consequently, the width of the base region between the collector and emitter, being controlled by a diffusion operation rather than a photographic technique requiring a high degree of resolution, may be narrower than that achieved using the surface-oriented method. The resultant transistor device 110, therefore, will have a higher gain than that produced by the surface-oriented method.

It is realized, of course, that the small opening 106 shown in FIGURE 13 (into which the donor impurity was deposited and diffused to form the base region 108) will be of a larger area than the small opening 115 shown in FIGURE 17 (into which the acceptor impurity was deposited to form the emitter region 115). Notwithstanding, the opening 106 would be of a very small area, approximately 0.05 sq. mil. Consequently, the operating area of the emitter-base junction 116 would still be extremely small, allowing for operation of the transistor 110 in the high-frequency range.

As the final steps in the manufacture of the transistor 110, photographic masking and etching techniques are utilized to expose the upper surface of the emitter, base and collector layers so that ohmic contacts may be deposited upon the exposed areas for the subsequent connection of external leads. The entire upper surface of the transistor 110 is first subjected to an etchant fluid. Since the oxide layer 118 shown in FIGURE 14 is substantially thinner than any of the other oxide layers 101 or 111, it is possible to control this etching step so as to completely cut through the layer 118 and expose the emitter region 115 without consequently cutting through any of the other layers.

Photomasking and etching are then employed so as to cut through the oxide layers 111 and 102 exposing the base layer 108 and the collector layer 103 respectively. Expanded ohmic contacts fabricated of aluminum or molybdenum and gold, for example, are then deposited upon the exposed regions, and gold wires are bonded to the ohmic contacts to form the emitter lead 120, the base lead 121, and the collector lead 122 as illustrated in the plan view of FIGURE 15. In the same manner as described in the preceding embodiment, a matrix of elongated slots may be placed upon a single wafer, and the subsequently produced emitters, bases, and collectors connected together in a conventional manner, the resultant device having the characteristics of high frequency, high power and high gain.

A specific feature of this invention involves the use of intrinsic material, having very high resistivity as the inital substrate in most of the above-described embodiments. As a result, a minimum contact area is maintained, thus minimizing any stray capacitance within the devices.

Another feature of this invention involves the orientation of the elongated slots formed by the photographic masking and etching techniques described. Although it is to be pointed out that when the elongated slots are placed perpendicular to each other, the resulting apertures formed at the intersection of the slot will be of a minimum area, the intersection of the slots at oblique angles will also produce very small apertures which are well defined and free from distortion, thus allowing for a small geometry junction to subsequently be fabricated.

The so-called negative resist has been heretofore described in connection with the process of this invention. When using a negative resist, the exposed portion of the material is polymerized and the unexposed portion is removed by development to form the slots through which the oxide is etched. However, it is to be understood that a positive resist could also be used, in which case the exposed portion is deploymerized and removed by the developing solution. In such a case, the narrow slot in the resist may be exposed by light or by an electron beam and the process carried out as previously described.

Although the above description of the process for manufacturing the small geometry diodes and the small geometry transistor structures have been referenced to a P-N or PNP type diffusion, it will be appreciated that it is equally applicable to N-P and NPN type diffusions.

While the invention has been described with reference to specific methods and embodiments, it is to be understood that this description is not to be construed in a limiting sense. Various modifications of the disclosed embodiments, as well as other embodiments of the invention may become apparent to persons skilled in the art without departing from the spirit and scope of the invention as defined by the appended claims.

What is claimed is:

1. A method of making a semiconductor device comprising the steps of:
  (a) forming an insulating layer adjacent one surface of a body of semiconducting material,
  (b) forming a first narrow elongated slot in said insulating layer,
  (c) forming a first diffused region of semiconducting material beneath said first elongated slot and within said body of semiconducting material having conduction carriers of one type predominating,
  (d) forming another insulating layer upon the upper surface of said first diffused region and within said first elongated slot,
  (e) forming a second narrow elongated slot in said first and said second mentioned insulating layers, the length of said second elongated slot transversely intersecting the length of said first elongated slot thereby defining a hole in said second-mentioned insulating layer at the intersection of said first elongated slot and said second elongated slot,
  (f) forming another diffused region of semiconducting material beneath said hole having conduction carriers of opposite type predominating thereby forming a junction within said first diffused region,
  (g) forming individual ohmic contacts connected to each of said diffused regions.

2. The method of making the semiconductor device of claim 1, wherein said second elongated slot is formed at an angle substantially perpendicular to said first elongated slot.

3. A method of making a semiconductor device comprising the steps of:
  (a) forming an insulating layer adjacent one surface of a body of semiconducting material,
  (b) forming a first narrow elongated slot in said insulating layer,
  (c) forming another insulating layer upon the upper surface of said body and within said first elongated slot,
  (d) forming second and third narrow elongated slots in said first and second-mentioned insulating layers, the lengths of said second and third elongated slots transversely intersecting the length of said first elongated slot, thereby defining a pair of holes in said second mentioned insulating layer at the intersection of said first elongated slot and said second and third elongated slots,
  (e) forming a diffused region of semiconducting material beneath one of said pair of holes and within said body of semiconductor material having conduction carriers of one type predominating.
  (f) forming a second diffused region beneath the other of said pair of holes and within said body of semiconductor material having conduction carriers of opposite type predominating, and
  (g) forming ohmic contacts connected to each of the diffused regions.

4. The method of making the semiconductor device of claim 3 wherein said second and third elongated slots are formed substantially parallel to each other, each of said second and third elongated slots intersecting said first elongated slot at an angle substantially perpendicular thereto.

5. A method of forming a semiconductor device comprising the steps of:
  (a) forming an insulating layer adjacent one surface of a body of semiconducting material,
  (b) forming a first narrow elongated slot in said insulating layer,
  (c) forming a first diffused region of semiconducting material beneath said first elongated slot and within said body having conduction carriers of one type predominating,
  (d) forming another insulating layer upon the upper surface of said region and within said first elongated slot,
  (e) forming second and third elongated slots in said first and second-mentioned insulating layers, each of said second and third elongated slots having a width substantially equal to the width of said first elongated slot, the lengths of said second and third elongated slots transversely intersecting the length of said first elongated slot, thereby defining a pair of holes in said second mentioned insulating layer at the intersections of the first elongated slot and said second and third elongated slots,
  (f) forming a second diffused region beneath one of said pair of holes,
  (g) forming a third diffused region beneath the second of said pair of holes, each of said second and third diffused regions being of semiconductor material having conduction carriers of opposite type predominating and forming a junction within said first diffused region, and (h) forming individual ohmic contacts connected to each of the diffused regions.

6. The method of making the semiconductor device of claim 5 wherein said second and third elongated slots are formed substantially parallel to each other, each of said second and third elongated slots intersecting said first elongated slot at an angle substantially perpendicular thereto.

7. A method of making a semiconductor device comprising the steps of:

(a) forming an insulating layer adjacent one surface of a body of semiconducting material, (b) forming a first narrow elongated slot in said insulating layer, (c) forming a first diffused region of semiconducting material beneath said first elongated slot within said body having conduction carriers of one type predominating, (d) forming another insulating layer upon the upper surface of said first diffused region and within said first elongated slot, (e) forming an opening in said first and second mentioned insulating layers of given width intersecting said first elongated slot, thereby defining a first hole in said second-mentioned insulating layer at the intersection of said first elongated slot and said opening, (f) forming a second diffused region of semiconductor material beneath said first hole having conduction carriers of opposite type predominating and forming a junction within said first diffused region, (g) forming a third insulating layer upon the upper surface of said second diffused region and within said first hole, (h) forming a second elongated slot in said first and third-mentioned insulating layers of a width substantially equal to the width of said first elongated slot and of a width less than said given width of said opening substantially parallel to and within the boundaries defined by said opening, the length of said second elongated slot transversely intersecting the length of said first elongated slot, thereby defining a second hole in said third insulating layer at the intersection of said first elongated slot and said second elongated slot, (i) forming a third diffused region of semiconducting material beneath said second hole having conduction carriers of said one type predominating and forming a second junction within said second diffused region, and (j) forming individual ohmic contacts connected to each of the diffused regions.

References Cited

UNITED STATES PATENTS

| | | | |
|---|---|---|---|
| 3,165,430 | 12/1965 | Hugle | 317—235 |
| 3,245,794 | 12/1966 | Conley | 148—187 |
| 3,246,214 | 12/1966 | Hugle | 317—235 |

HYLAND BIZOT, *Primary Examiner.*

JOHN W. HUCKERT, *Examiner.*

J. D. CRAIG, *Assistant Examiner.*